United States Patent
Sukharev et al.

(10) Patent No.: US 6,935,933 B1
(45) Date of Patent: Aug. 30, 2005

(54) VISCOUS ELECTROPOLISHING SYSTEM

(75) Inventors: Valeriy Sukharev, Cupertino, CA (US); Wilbur G. Catabay, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 465 days.

(21) Appl. No.: 10/036,621

(22) Filed: Dec. 21, 2001

(51) Int. Cl.⁷ .............................................. B24B 7/22
(52) U.S. Cl. ......................................... 451/57; 451/41
(58) Field of Search .............................. 451/41, 29, 30, 451/31, 57; 438/692, 693; 205/640, 123, 205/157, 220

(56) References Cited

U.S. PATENT DOCUMENTS

| | | | | |
|---|---|---|---|---|
| 2,752,305 A | * | 6/1956 | Turner ......................... | 205/660 |
| 4,564,425 A | * | 1/1986 | Janousek et al. ........... | 205/210 |
| 6,149,830 A | * | 11/2000 | Lin et al. ...................... | 216/89 |
| 6,306,012 B1 | * | 10/2001 | Sabde ......................... | 451/41 |
| 6,315,883 B1 | * | 11/2001 | Mayer et al. ............... | 205/123 |
| 6,376,952 B1 | * | 4/2002 | Stenta ......................... | 310/90 |
| 6,756,307 B1 | * | 6/2004 | Kelly et al. ................. | 438/691 |

OTHER PUBLICATIONS

Wang et al., *Stress-free polishing advances copper integrated with ultralow-k dielectrics*, Solid State Technology, pp. 101-106, Oct. 2001.

* cited by examiner

*Primary Examiner*—Robert A. Rose
(74) *Attorney, Agent, or Firm*—Luedeka, Neely & Graham PC

(57) ABSTRACT

A method for planarizing a surface of an electrically conductive layer on a substrate, where the surface of the electrically conductive layer has relatively high features and relatively low features. A viscous material is applied to the surface of the electrically conductive layer, whereby at least the relatively low features are covered by the viscous material. The substrate is immersed in an electrically conductive solution. An electrical potential is applied between the electrically conductive layer and an electrode within the electrically conductive solution, whereby reaction kinetics favor erosion of the electrically conductive layer. The electrically conductive solution is agitated, thereby selectively uncovering the viscous material from at least features that are relatively high, and thereby preferentially planarizing at least the features that are relatively high.

17 Claims, 1 Drawing Sheet

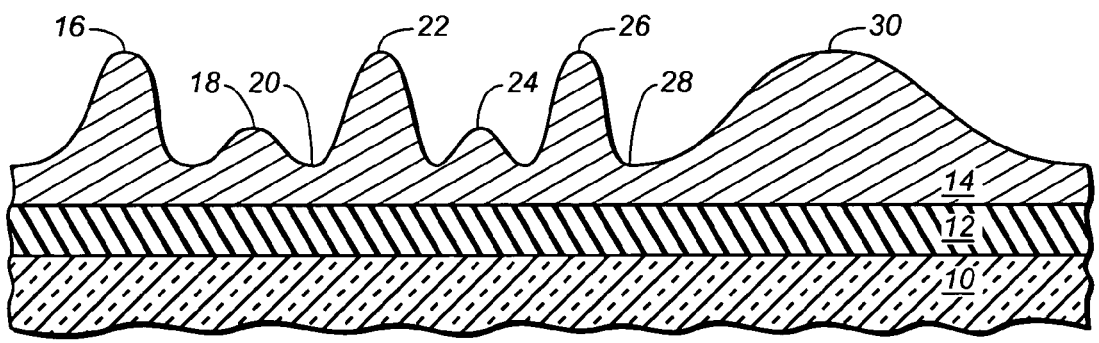
FIG._1
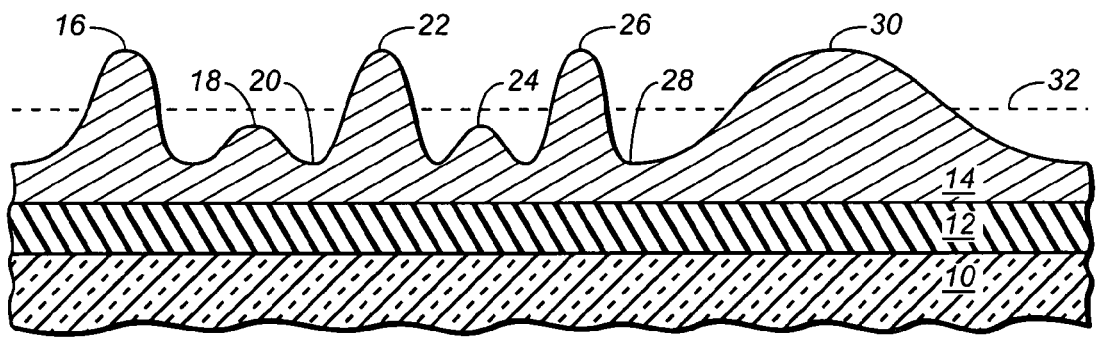
FIG._2
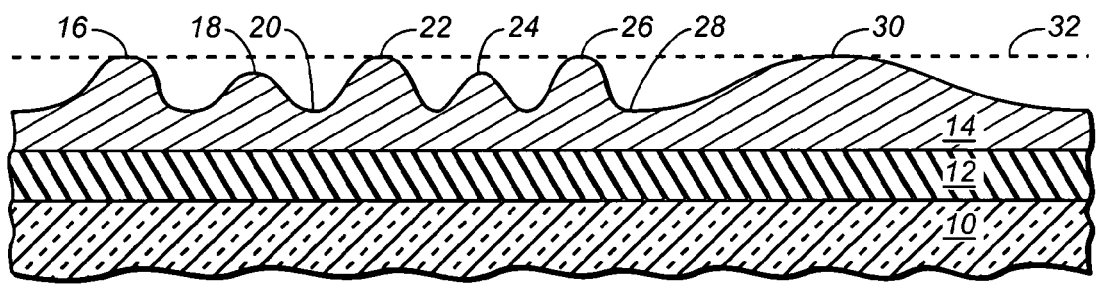
FIG._3
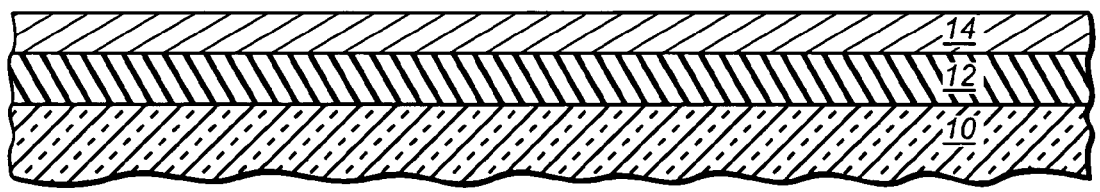
FIG._4

VISCOUS ELECTROPOLISHING SYSTEM

FIELD

This invention relates to the field of integrated circuit fabrication. More particularly, this invention relates to a method for planarizing the surface of an integrated circuit substrate.

BACKGROUND

As the size of integrated circuits continues to decrease, different materials and methods are required to fabricate them. For example, as the size of the electrically conductive interconnections in the integrated circuits decreases, the electrical resistance of the interconnections tends to increase, impairing the function of the integrated circuits. Thus, new materials are sought out to replace the materials that were once used. Specifically, copper is increasingly used as an interconnect material, because it tends to be more conductive than the aluminum that was predominantly used in the past.

By way of further example, as the thickness of the electrically insulating material that is used between the electrically conductive interconnections grows thinner and thinner, the capacitance effect of the insulating material tends to increase. These capacitance effects tend to reduce the speed at which the completed integrated circuit can operate, thus tending to negate the benefits that should be realized by reducing the overall size of the integrated circuit. Therefore, new materials having lower capacitance values, generally referred to as low k materials, have been substituted for the predominantly used silicon oxides of the past, which had relatively higher capacitance values.

However, with new materials come new challenges. For some time it has been known that smaller integrated circuits are relatively easier to fabricate when a preceding one of the various deposited and formed layers from which they are made is planarized prior to deposition or formation of a seceding one of the layers. In this manner, the layers tend to be more conformal, one to the other, and mechanical stresses within the completed integrated circuit are generally reduced.

This planarization has typically been accomplished using a process called chemical mechanical polishing. During chemical mechanical processing, the integrated circuit is subjected to a polishing pad and a slurry that erodes the surface of the integrated circuit both chemically and mechanically. Unfortunately, the processes that worked well on the older materials tend to produce difficulties when applied to the new materials.

For example, the low k materials tend to be softer than the oxides that they replaced. Thus, a mechanically abrasive process such as chemical mechanical polishing tends to tear away delicate circuitry that is formed on top of a low k layer. Further, copper structures tend to dish or hollow out at their top surface when exposed to chemical mechanical polishing. Thus, when applied to low k materials and copper structures either alone or in combination, chemical mechanical polishing tends to produce additional problems in conjunction with the new materials.

What is needed, therefore, is a method of planarizing the surface of an integrated circuit, which method does not require the mechanically abrasive action inherent in chemical mechanical polishing.

SUMMARY

The above and other needs are met by a method for planarizing a surface of an electrically conductive layer on a substrate, where the surface of the electrically conductive layer has relatively high features and relatively low features. A viscous material is applied to the surface of the electrically conductive layer, whereby at least the relatively low features are covered by the viscous material. The substrate is immersed in an electrically conductive solution. An electrical potential is applied between the electrically conductive layer and an electrode within the electrically conductive solution, whereby reaction kinetics favor erosion of the electrically conductive layer. The electrically conductive solution is agitated, thereby selectively uncovering the viscous material from at least features that are relatively high, and thereby preferentially planarizing at least the features that are relatively high.

In this manner, the surface of the electrically conductive layer is planarized using a relatively gentle electrochemical polishing process, rather than a relatively harsh chemical mechanical polishing process. Further, by applying the viscous material to the surface of the electrically conductive layer, those features that are relatively low are protected from etching, while those features that are relatively high are preferentially etched.

This is especially beneficial for surfaces having features that are both relatively broad and relatively low, as such features tend to etch at a rate that is similar to that for features that are relatively high. Etching such features that are both relatively broad and relatively low tends to frustrate the goal of planarizing the surface, especially when such features are thinned at a rate that is substantially similar to that of the relatively high features. Thus, a method according to a preferred embodiment of the present invention tends to overcome such problems and provides a planarized surface.

In various preferred embodiments of the invention, the viscous material is a liquid, such as glycerol or silicone oil, and may alternately be either electrically conductive or electrically non conductive. The viscosity of the viscous material is most preferably at least about five centipoise. In one embodiment, the viscous material is the electrically conductive solution, and in another embodiment the viscous material is mixed into the electrically conductive solution, either prior to or after the substrate is immersed in the electrically conductive solution. The viscous material may alternately be applied by dipping, swabbing, or spinning.

In a most preferred embodiment, the agitation is increased as the relatively high features are planarized, thereby selectively uncovering features that are relatively low, and thereby planarizing the features that are relatively low. In this manner, as the relatively high features are etched, they become relatively low features, which are then further etched, until the entire surface of the substrate is preferably planarized.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 1 is a cross sectional view of an electrically conductive layer on a substrate, where the electrically conductive layer has features that are at least one of relatively high, relatively low, relatively narrow, and relatively broad, FIG. 2 is a cross sectional view of the electrically conductive layer of FIG. 1, where a viscous material has been applied to the surface of the electrically conductive layer, FIG. 3, is a cross sectional view of the electrically conductive layer of FIG. 2, where the relatively high features have been preferentially etched, and FIG. 4 is a cross sectional view of the electrically conductive layer of FIG. 3, where the surface of the electrically conductive layer has been planarized.

DETAILED DESCRIPTION

Referring now to FIG. 1, there is depicted a cross sectional view of an electrically conductive layer 14 on a substrate 10, where the electrically conductive layer 14 has features 16–30 that are at least one of relatively high, relatively low, relatively narrow, and relatively broad. These feature classifications are described more completely below. As depicted, the electrically conductive layer 14 is formed on top of an intermediate layer 12, which is preferably planarized. The layer 12 may be an electrically non conductive layer, such as a low k layer. The layer 12 also may comprise more than one intermediary layer between the electrically conductive layer 14 and the substrate 10.

One purpose of a method according to a preferred embodiment of the present invention is to planarize the electrically conductive layer 14. By "planarize" it is meant to at least partially etch those features that are relatively high on the surface of the electrically conductive layer 14 so that they more nearly extend to the same distance from the underlying top surface of the intermediary layer 12 as do the features that are relatively low on the surface of the electrically conductive layer 14, and thereby produce a surface that is more planar.

With continued reference to FIG. 1, the relative qualities of the features 16–30 are now described with more particularity. As can be seen, features 16, 22, 26, and 30 extend a greater distance from the underlying surface of the intermediary layer 12 than do features 18, 20, 24, and 28. Therefore, features 16, 22, 26, and 30 are classified as features that are relatively high. Features 18 and 24 extend to a lesser distance from the underlying surface of the lower layer 12 than do features 16, 22, 26, and 30. Therefore, features 18 and 24 are relatively low features in comparison to features 16, 22, 26, and 30. Similarly, features 20 and 28 also extend to a lesser distance from the underlying surface of the intermediary layer 12 than do features 16, 22, 26, and 30. Thus, features 20 and 28 are also relatively low features.

It is further noted that features 18 and 24 extend to a greater distance from the underlying surface of the intermediary layer 12 than do features 20 and 28. Therefore, in comparison to features 20 and 28, features 18 and 24 are considered to be relatively high features. Thus it is seen that the category into which a feature falls, whether it be relatively high or relatively low, is determined more upon those features to which it is compared, or alternately the characteristics of those other features which currently exist, than to some absolute reference.

In another sense, features 16, 18, 22, and 26 are relatively narrow features, by which it is meant that they are disposed relatively closely one to another. Feature 30, on the other hand, is classified as a relatively broad feature as it is not disposed relatively closely to any other feature. Those features which are disposed at about a micron or more apart from one another are generally regarded as relatively broad features, as the term is used herein, which those features which are disposed at less than about a micron or more apart from one another are generally regarded as relatively narrow features, as the term is used herein.

During electrochemical polishing, such as is similar to that described below, some of the features tend to preferentially etch. For example, the relatively high features such as 16, 22, 26, and 30 tend to preferentially etch during an electrochemical etching process. This particular characteristic of electrochemical polishing is fortunate, as it tends to be those relatively higher features 16, 22, 26, and 30 which most need to be etched to planarize the electrically conductive layer 14. Unfortunately, relatively low features, such as feature 28, which are disposed adjacent relatively broad features, such as feature 30, also tend to preferentially etch. Conversely, relatively low features, such as feature 20, and to some extent features 18 and 24, that are also disposed in close proximity to relatively high and relatively narrow features, tend to etch at a lower rate.

Without being bound by theory, one reason that the features described above tend to preferentially etch may be that the electrochemical polishing bath which surrounds these features tends to be more open for transport of the various species which both carry electrical charges to, and atomic species from the surface of the electrically conductive layer 14.

Regardless of such theory, it is desired that the relatively low features such as feature 28 not etch during an electrochemical polishing process at the same time, or alternately at the same rate, as the relatively high features 16, 22, 26, and 30.

Thus, in accordance with a method according to a preferred embodiment of the present invention, a viscous material 32 is preferably applied to the surface of the electrically conductive layer 14, as given in FIG. 2. The dashed line in FIG. 2 represents a top surface of the viscous material 32, which differentiates such a top surface from a solid top surface, such as for the electrically conductive layer 14 and the intermediary layer 12.

The viscous material 32 may be applied in a number of different ways, including spinning, dipping, swabbing, brushing, rolling and any other way known in the art and which is compatible with the materials, processes, and structures as described or referenced herein. Alternately, the viscous material 32 may be incorporated into the electrochemical polishing bath, in a manner as more completely described below.

The viscous material 32 is most preferably a liquid, but may alternately have such a high viscosity as to more correctly be categorized as a thixotropic fluid. Most preferably the viscosity of the viscous material 32 is between about five centipoise and about two thousand centipoise, and most preferably about fourteen hundred and ninety centipoise. The viscous material 32 may be either electrically conductive or electrically non conductive, as discussed in more detail below. Most preferably the viscous material is glycerol. Preferably the viscous material 32 is a substance that is compatible with the materials, processes, and structures as described or referenced herein.

Most preferably, the viscous material 32 has some type of affinity, such as a weak chemical attraction, for the material which comprises the electrically conductive layer 14. It is also preferred that the viscous material tend to not break down in the electrochemical bath to which it will be exposed, as described in more detail below, which electrochemical baths tend to be either strongly acidic or strongly basic. As mentioned above, glycerol is a good viscous material 32, as it tends to provide a good balance within the desired characteristics as mentioned above.

The substrate 10 is placed in the electrochemical bath, and an electrical voltage potential is applied across at least two electrodes that make electrical contact with the electrochemical bath. This may be accomplished in a number of different ways, as is known in the art, and the present invention is not to be limited by any specific electrode configuration.

As alluded to above, when the electrical potential is applied in the electrochemical bath, it is preferably applied such that the reaction kinetics favor the erosion of material from the surface of the electrically conductive layer 14 of the substrate 10. Also as introduced above, the erosion tends to be favored at the features 16, 22, 26, and 30 that are relatively high on the electrically conductive layer 14. The viscous material 32 selectively reduces the effects of the electrical field created by the electrical potential in those areas where the viscous material 32 is present at the surface of the electrically conductive layer 14. For example, those portions of the surface of the electrically conductive layer 14 that are covered by the viscous material 32 as depicted in FIG. 2, tend to etch at a lower rate than those portions of the surface of the electrically conductive layer 14 that are not covered by the viscous material 32. Furthermore, those features that are covered under a deeper layer of the viscous material 32 are preferably inhibited from etching to an even greater degree by the covering of the viscous material 32.

Thus, the relatively higher features 16, 22, 26, and 30 tend to preferentially etch, which is desired, as they are the features that most need to be reduced in size to planarize the electrically conductive layer 14. At the same time, the relatively lower feature 28 is selectively inhibited from etching to at least some degree by the viscous material 32 which covers it, as depicted in FIG. 3. If it were not for this inhibiting action from the viscous material 32, the relatively lower feature 28, because it is proximate a relatively broad feature 30, would tend to etch at substantially the same rate as the relatively high features 16, 22, 26, and 30. Such etching of the relatively low and broad feature 28 would not be desirable because it would tend to negate the effect of etching the relatively high features in terms of planarizing the surface of the electrically conductive layer 14.

When the viscous material 32 is an electrically conductive material, it is not essential that the viscous material 32 leave any portion of the features on the surface of the electrically conductive layer 14 exposed, as some effects of the electrical field created by the applied electrical potential through the electrochemical bath will tend to produce an etching effect on the relatively high features, regardless of the fact that they are covered by the viscous material 32. By using such a technique, an extra degree of control over the rate of etching can be exercised, by adjusting the depth at which such relatively high features are covered with the viscous material 32.

Alternately, when the viscous material 32 is an electrically nonconductive material, at least a portion of the relatively high features on the surface of the electrically conductive layer 14 are left exposed, so that the effects of the electrical field created by the applied electrical potential through the electrochemical bath are able to produce an etching effect on the exposed or uncovered relatively high features.

In either situation, whether the viscous material 32 is electrically conductive or electrically nonconductive, the degree of etching of the relatively high features is preferably adjustable by agitating the electrochemical bath. At a relatively low degree of agitation, the weak attraction between the viscous material 32 and the material of the electrically conductive layer 14 is sufficient to cover a relatively greater portion of the surface of the electrically conductive layer 14, while at a relatively high degree of agitation, the weak attraction between the viscous material 32 and the material of the electrically conductive layer 14 is a relatively smaller influence, and the viscous material 14 tends to cover a relatively lesser portion of the surface of the electrically conductive layer 14.

For example, at a first relatively low degree of agitation, only the relatively highest features such as features 16, 22, 26, and 30 may be exposed to the electrochemical bath through the viscous material 32, while at a second relatively high degree of agitation, features such as 18 and 24 may also be exposed to the electrochemical bath through the viscous material 32. In this manner, the degree to which the surface of the electrically conductive layer 14 is etched is selectable. In a most preferred embodiment, the agitation is produced by stirring the electrochemical bath, while in alternate embodiments the agitation is produced in other ways, such as sparging the electrochemical bath with an inert gas, circulating the electrochemical bath through a flow system, mechanically rocking the substrate 10, or applying sonic waves, such as ultrasonic vibration, to the electrochemical bath.

In a similar vein, as the relatively high features etch, the degree of agitation can be increased so that more and more of the relatively high features are uncovered and are etched, which gradually planarizes the surface of the electrically conductive layer 14 to about the level of the relatively low features 20 and 28, which preferentially have been substantially protected from etching by the effects of the viscous material 32 which covers them. Such effects, in addition to a reduction of the electrical field as described above, may also include an inhibition of the transport kinetics which may be required by the specific chemistry of the electrochemical bath. Thus, at the end of the process, a planarized electrically conductive layer 14 is produced, such as depicted in FIG. 4.

As mentioned above, the viscous material 32 may be the electrically conductive solution of the electrochemical bath. In this manner, the reduction in the electrical field and transport kinetics occurs at the relatively low features to a greater extent, while such reductions occur at the relatively high features to a lesser extent. Alternately, the viscous material 32 is mixed in with the electrically conductive solution of the electrochemical bath, and the weak attractive forces between the viscous material 32 and the material of the electrically conductive layer 14 draws the viscous material 32 onto the surface of the electrically conductive layer 14, providing the effects as described above.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for planarizing a surface of an electrically conductive layer on a substrate, where the surface of the electrically conductive layer has relatively high features and relatively low features, the method comprising the steps of:
   applying a viscous material to the surface of the electrically conductive layer, whereby at least the relatively low features are covered by the viscous material,
   immersing the substrate in an electrically conductive solution that does not contain appreciable amounts of the viscous material, which immersing occurs after the viscous material has been applied to the surface of the electrically conductive layer,
   applying an electrical potential between the electrically conductive layer and an electrode within the electrically conductive solution, whereby reaction kinetics favor erosion of the electrically conductive layer, and
   agitating the electrically conductive solution to a degree known to selectively uncover features that are relatively high to a desired degree, and thereby preferentially planarizing at least the features that are relatively high.

2. The method of claim 1 wherein the viscous material is a liquid.

3. The method of claim 1 wherein the viscous material is electrically conductive.

4. The method of claim 1 wherein the viscous material is glycerol.

5. A method for planarizing a surface of an electrically conductive layer on a substrate, where the surface of the electrically conductive layer has relatively high features and relatively low features, the method comprising the steps of:
   applying a viscous material to the surface of the electrically conductive layer, whereby at least the relatively low features are covered by the viscous material, wherein the viscous material is a silicone oil,
   immersing the substrate in an electrically conductive solution,
   applying an electrical potential between the electrically conductive layer and an electrode within the electrically conductive solution, whereby reaction kinetics favor erosion of the electrically conductive layer, and
   agitating the electrically conductive solution, thereby selectively uncovering at least features that are relatively high, and thereby preferentially planarizing at least the features that are relatively high.

6. The method of claim 5 wherein the viscous material has a viscosity of at least about five centipoise.

7. The method of claim 5 wherein the viscous material is the electrically conductive solution.

8. The method of claim 5 wherein the viscous material is applied by dipping.

9. A method for planarizing a surface of an electrically conductive layer on a substrate, where the surface of the electrically conductive layer has relatively high features and relatively low features, the method comprising the steps of:
   applying a viscous material to the surface of the electrically conductive layer, whereby at least the relatively low features are covered by the viscous material, wherein the viscous material is applied by one of swabbing and spinning onto the surface of the electrically conductive layer,
   immersing the substrate in an electrically conductive solution,
   applying an electrical potential between the electrically conductive layer and an electrode within the electrically conductive solution, whereby reaction kinetics favor erosion of the electrically conductive layer, and
   agitating the electrically conductive solution, thereby selectively uncovering at least features that are relatively high, and thereby preferentially planarizing at least the features that are relatively high.

10. The method of claim 5 wherein the electrically conductive layer is copper.

11. The method of claim 5 wherein the substrate is formed of silicon.

12. The method of claim 5 wherein the agitation is produced by stirring the electrically conductive solution.

13. A method for planarizing a surface of an electrically conductive layer on a substrate, where the surface of the electrically conductive layer has relatively high features and relatively low features, the method comprising the steps of:
   applying a viscous material to the surface of the electrically conductive layer, whereby at least the relatively low features are covered by the viscous material,
   immersing the substrate in an electrically conductive solution,
   applying an electrical potential between the electrically conductive layer and an electrode within the electrically conductive solution, whereby reaction kinetics favor erosion of the electrically conductive layer,
   agitating the electrically conductive solution, thereby selectively uncovering at least features that are relatively high, and thereby preferentially planarizing at least the features that are relatively high,
   increasing the agitation as the relatively high features are planarized, thereby selectively uncovering features that are relatively low, and
   thereby planarizing the features that are relatively low.

14. The method of claim 13, wherein planarization of the features that are relatively high is accomplished at a first current density and planarization of the features that are relatively low is accomplished at a second current density.

15. The method of claim 14, wherein the first current density is greater than the second current density.

16. A method for planarizing a surface of an electrically conductive layer on a substrate, where the surface of the electrically conductive layer has features that are at least one of relatively closely spaced, relatively broadly spaced, relatively high, and relatively low, the method comprising the steps of:
   applying a viscous material to the surface of the electrically conductive layer, whereby at least the relatively low features are covered by the viscous material,
   immersing the substrate in an electrically conductive solution,
   applying an electrical potential between the electrically conductive layer and an electrode within the electrically conductive solution, whereby reaction kinetics favor erosion of the electrically conductive layer,
   agitating the electrically conductive solution, thereby selectively uncovering at least features that are relatively high, and thereby preferentially planarizing at least the features that are relatively high, and preferentially protecting features that are both relatively low and relatively broad,
   increasing the agitation as the relatively high features are planarized, thereby selectively uncovering features that are relatively low, and
   thereby planarizing the features that are relatively low.

17. The method of claim 16 wherein the electrically conductive layer is copper.

* * * * *